United States Patent [19]

Hoffmann et al.

[11] 4,347,588
[45] Aug. 31, 1982

[54] MOS-INTEGRATED CIRCUIT ARRANGEMENT FOR SUPPRESSING QUIESCENT CURRENTS FLOWING IN WORD LINE DRIVERS OF SEMICONDUCTOR MEMORIES

[75] Inventors: Kurt Hoffmann, Taufkirchen; Karl J. Zapf, Munich, both of Fed. Rep. of Germany

[73] Assignee: Siemens Aktiengesellschaft, Berlin and Munich, Fed. Rep. of Germany

[21] Appl. No.: 104,579

[22] Filed: Dec. 17, 1979

[30] Foreign Application Priority Data

Dec. 22, 1978 [DE] Fed. Rep. of Germany ....... 2855744

[51] Int. Cl.³ .............................................. G11C 11/40
[52] U.S. Cl. ..................................... 365/206; 365/208

[58] Field of Search ...................... 365/206, 208, 175; 307/238, 279

[56] References Cited

U.S. PATENT DOCUMENTS 4,195,239  3/1980  Suzuki ................................. 365/208

Primary Examiner—Terrell W. Fears
Attorney, Agent, or Firm—Herbert L. Lerner; Laurence A. Greenberg

[57] ABSTRACT

MOS integrated circuit arrangement for suppressing quiescent currents flowing in word line drivers of semiconductor memories, including respective controlled switches addressed by a storage activation signal, the controlled switches being connected between the output circuit of the word line drivers and reference potential.

3 Claims, 1 Drawing Figure

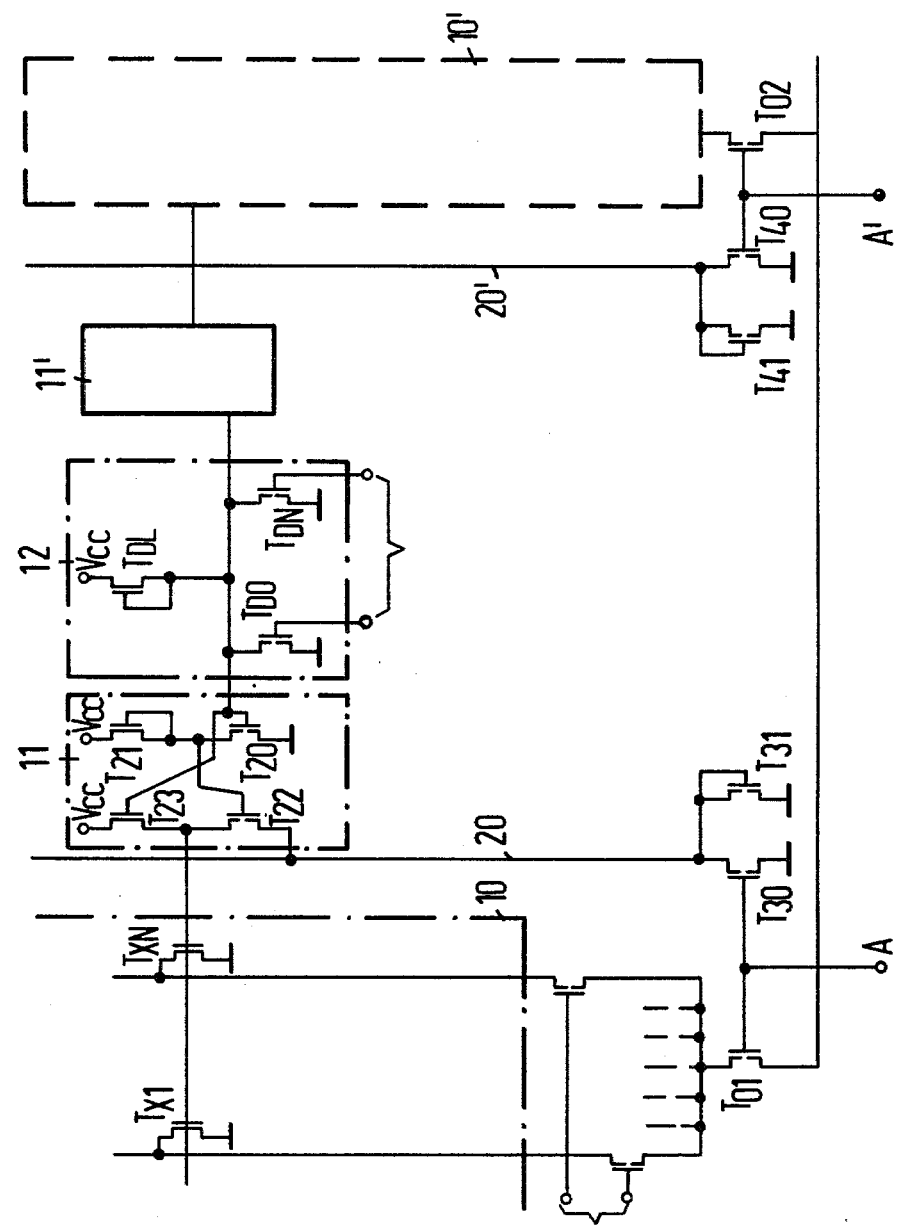

MOS-INTEGRATED CIRCUIT ARRANGEMENT FOR SUPPRESSING QUIESCENT CURRENTS FLOWING IN WORD LINE DRIVERS OF SEMICONDUCTOR MEMORIES

The present invention relates to an MOS-integrated arrangement for suppressing quiescent currents flowing in word line drivers of semiconductor memories.

In integrated semiconductor memories, such as in read-only memories (ROMs), for example, the word lines of the memory are addressed by word line decoders through word line drivers which serve for increasing the addressing speed.

When switching transistors of the line driver output stages are connected to ground, quiescent currents always flow through the word line drivers if the word lines assigned thereto have not been selected by the word line decoder. This is due to residual currents of depletion type transistors.

It is accordingly an object of the invention to provide a MOS integrated circuit arrangement for suppressing quiescent currents flowing in word line drivers of semiconductor memories, which overcomes the hereinafore mentioned disadvantages of the heretofore known devices of this general type, and which may be used for currents flowing in nonselected word line drivers.

With the foregoing and other objects in view there is provided, in accordance with the invention, a MOS integrated circuit arrangement for suppressing quiescent currents flowing in word line drivers of semiconductor memories, comprising respective controlled switches addressed by a storage activation signal, the controlled switches being connected between the output circuit of the word line drivers and reference potential.

In accordance with another feature of the invention, the controlled switches are MOS transistors of the enrichment type.

In accordance with a concomitant feature of the invention, there are provided diode-connected MOS transistors, the diode-connected MOS transistors being shunted across the controlled switches to reference potential.

Other features which are considered as characteristic for the invention are set forth in the appended claims.

Although the invention is illustrated and described herein as embodied in MOS-integrated circuit arrangement for suppressing quiescent currents flowing in word line drivers of semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single FIGURE of the drawing which is a schematic circuit diagram for driving word lines of an intetrated semiconductor memory of a ROM.

Referring now more particularly to the figure of the drawing there are shown two schematically illustrated cell fields 10 and 10' of a semiconductor ROM which are of known construction. Each of the cell fields 10,10' contains, for instance, 16-K storage locations. Each storage location is formed in the cell fields 10, 10' by a MOS transistor. Two of these transistors $T_{x1}$ and $T_{xN}$ of a memory row x are shown in the memory field 10 on the left-hand side of the figure. Programming is accomplished, for instance, in such a manner that the gate oxide of the transistors has a different thickness, where, for instance, a relatively thin gate oxide corresponds to a stored logic level 1 and a relatively thick gate oxide to a stored logic level 0. The memory transistors are addressed line by line through word lines; one word line $WL_X$ for the row X is shown. The columns of the memory transistors are addressed through bit lines. Two of the bit lines $BL_1$ and $BL_N$ for the two memory transistors $T_{X1}$ and $T_{XN}$ are shown. Selector transistors $T_1$ to $T_N$, through which a bit line can be selected by means of addresses by a non-illustrated bit line decoder are connected into the bit line. The construction of the cell field 10', shown only in block form by means of broken lines, corresponds identically to the cell field 10.

Each cell field 10,10', as a whole, is brought to a non-illustrated read amplifier through a selector transistor $T_{01}$, $T_{02}$, respectively, whereby a cell field can be selected by addressing the respective selection transistor by means of a memory activation signal or a cell field address A or A', respectively.

Each of the word lines of the cell fields 10,10' described above are addressed by a word line decoder 12 through a word line drive 11, 11', respectively. The word line decoder 12 contains a number of MOS transistors $T_{D0}$ to $T_{DN}$ which are acted on by word line addresses, are preferably transistors of the enrichment type, and are connected in parallel to a line controlling the word line drivers 11,11'. These control transistors have a common load resistance which is formed by a MOS transistor $T_{DL}$ of the depletion type, that is wired as a resistor and is connected to a supply voltage $V_{cc}$. Such a word line decoder 12 thus forms a NOR decoder in a well known manner.

The word line drivers 11,11' are constructed as two-stage amplifiers. The input stage of the line drivers 11,11' is formed by a switching transistor $T_{20}$ of the enrichment type, addressed by the word line decoder 12 and a load transistor $T_{21}$ of the depletion type, wired as a resistor, in the load circuit of the switching transistor $T_{20}$. The load transistor $T_{21}$ is connected to the supply voltage $V_{cc}$, while the switching transistor $T_{20}$ is connected to ground. An enrichment type switching transistor $T_{22}$ of an output stage is driven by the output of the input stage, i.e. from the junction point of the source-drain paths of the transistors $T_{20}$ and $T_{21}$. Into the load circuit of this switching transistor $T_{22}$ is connected another load transistor $T_{23}$ of the depletion type, which in turn is also connected to the supply voltage $V_{cc}$. The junction point of the source-drain paths of the transistor $T_{22}$ and $T_{23}$ forms the output, which is connected to the word line $WL_X$. The construction of the word line driver 11', which is only indicated schematically as a block, is identical to the construction of the word line driver 11, described above.

If the switching transistor $T_{22}$ of the output stage of the line driver 11 were connected to ground, like the switching transistor $T_{20}$ of the input stage, then due to residual currents of the transistors of the depletion type, quiescent currents would unavoidably flow through the word line drivers if the word lines assigned to them were not selected by the word line decoder.

It is an object of the present invention to provide a circuit for suppressing quiescent currents flowing in non-selected word line drivers.

According to the invention, this problem is solved, in a circuit arrangement of the hereinafore mentioned type by connecting the output circuit of the word line drivers to reference potential through respective controlled switches which are addressed by an activation signal.

In the circuit arrangement according to the figure of the drawing, which has largely been explained already, the switching transistor $T_{22}$ of the output stages of the word line drivers 11 and 11' are connected to a line 20 and 20' respectively, which are connected to ground through switching transistors $T_{30}$ and $T_{40}$, respectively. These transistors $T_{30}$, $T_{40}$ are likewise addressed by the memory activation signal or the cell field address A or A', respectively, by way of which a memory cell field 10 or 10' is selected as a whole. If there is no address signal A or A' for the respective memory cell field, one of the transistors $T_{30}$ or $T_{40}$ is not switched into conduction and no overall current can flow through the output circuits connected to the line 20 of the word line drivers.

Shunted across the transistors $T_{30}$ and $T_{40}$ are respective MOS transistors $T_{31}$ and $T_{41}$ of the enrichment type, which are connected as diodes and which prevent the line 20' from being too greatly charged up. This makes it possible to reduce the access times and to reduce the dynamic power (charge reversal of large capacities).

There is claimed:

1. MOS integrated circuit arrangement for suppressing quiescent currents flowing in word line drivers of semiconductor memories, comprising bit lines, word lines connected to the word line drivers, and respective controlled switch means addressed by a storage activation signal for suppressing residual currents in the word line drivers, said controlled switch means being connected between the output circuit of the word line drivers and reference potential.

2. Circuit arrangement according to claim 1, wherein said controlled switch means are MOS transistors of the enrichment type.

3. Circuit arrangement according to claim 1 or 2, including diode-connected MOS transistors, said diode-connected MOS transistors being shunted across said controlled switch means to reference potential.

* * * * *